(12) United States Patent (10) Patent No.: US 7,445,875 B2
Amemiya (45) Date of Patent: Nov. 4, 2008

(54) MASK BLANK AND MASK FOR ELECTRON BEAM EXPOSURE

(75) Inventor: Isao Amemiya, Yamanashi (JP)

(73) Assignee: Hoya Corporation, Tokyo (JP)

( * ) Notice: Subject to any disclaimer, the term of this patent is extended or adjusted under 35 U.S.C. 154(b) by 721 days.

(21) Appl. No.: 11/139,635

(22) Filed: May 31, 2005

(65) Prior Publication Data

US 2005/0266320 A1 Dec. 1, 2005

Related U.S. Application Data

(60) Provisional application No. 60/574,935, filed on May 28, 2004.

(51) Int. Cl.
*G03F 1/00* (2006.01)

(52) U.S. Cl. .......................................................... 430/5

(58) Field of Classification Search .................. 430/5, 430/296; 250/492.3
See application file for complete search history.

(56) References Cited

U.S. PATENT DOCUMENTS

| | | | |
|---|---|---|---|
| 5,260,151 A | 11/1993 | Berger et al. | |
| 5,466,904 A | 11/1995 | Pfeiffer et al. | |
| 5,935,739 A | 8/1999 | Bayer et al. | |
| 5,972,794 A | 10/1999 | Katakura | |
| 6,812,473 B1 | 11/2004 | Amemiya | |

FOREIGN PATENT DOCUMENTS

| | | |
|---|---|---|
| JP | 7201726 A | 8/1995 |
| JP | 10260523 A | 9/1998 |
| JP | 10261584 A | 9/1998 |
| JP | 10321495 A | 12/1998 |
| JP | 2001077013 A | 3/2001 |

OTHER PUBLICATIONS

Berger et al., "New approach to projection-electron lithography with demonstrated 0.1 μm linewidth," Appl. Phys. Letters 57 (2), Jul. 9, 1990, pp. 153-155.
Bohlen et al., "High Throughout Submicron Lithography with Electron Beam Proximity Printing," Solid State Technology, Sep. 1984, pp. 210-214.

*Primary Examiner*—Stephen Rosasco
(74) *Attorney, Agent, or Firm*—Sughrue Mion, PLLC

(57) ABSTRACT

A mask blank for electron beam exposure includes a pattern support layer that transmits an electron beam therethrough, an electron beam scattering layer formed on the pattern support layer, and a support body supporting the pattern support layer and the electron beam scattering layer. The pattern support layer is formed by a material that has an amorphous structure and that is mainly composed of carbon-silicon bonds. The pattern support layer is a tensional stress membrane that has a surface roughness of 0.2 (nm, Rms) or less. A mask for electron beam exposure is formed by patterning the electron beam scattering layer of the mask blank.

10 Claims, 16 Drawing Sheets

|  | NON-DOPED MEMBRANE | 23% Si-DOPED MEMBRANE | 43% Si-DOPED MEMBRANE | 61% Si-DOPED MEMBRANE | NOTES (EVALUATION METHODS) |
|---|---|---|---|---|---|
| FILM HARDNESS [GPa] | 12.2-13.0 | 18.9-19.3 | 22.9-23.5 | 21.8-22.2 | NANO-INDENTATION ANALYZER |
| YOUNG MODULUS [GPa] | 130-135 | 186-190 | 230-236 | 218-226 | BULGE METHODS, NANO-INDENTATION ANALYZER |
| FILM DENSITY [g/cm$^3$] | 2.01 | 2.38-2.43 | 2.68-2.70 | 2.58-2.62 |  |
| SURFACE ROUGHNESS (Rms)[nm] | 0.497 (AT 1.5 Pa DEPO.) | 0.214 (AT 0.6 Pa DEPO.) | 0.131 (AT 0.3 Pa DEPO.) | 0.129 (AT 0.3 Pa DEPO.) | AFM |

FIG. 6

MASK BLANK AND MASK FOR ELECTRON BEAM EXPOSURE

CROSS REFERENCE TO RELATED APPLICATION

This application claims the benefit of U.S. Provisional Application No. 60/574,935 filed May 28, 2004.

BACKGROUND OF THE INVENTION

This invention relates to a mask blank and a mask and, in particular, relates to a mask blank and a mask for electron beam exposure.

In the lithography technology for forming wiring patterns and so on, as patterns to be formed become extremely finer and finer, the pattern formation becomes difficult in the conventional optical lithography technology that is used as a general purpose technology. Therefore, a serious investigation has been directed to an exposure technique using a short-wavelength beam, like a charged particle beam such as an electron beam or an ion beam, an X-ray, or the like so as to achieve further finer pattern formation. Among them, the direct-write electron beam technique has been developed from initial point beam writing, then a variable shaping projection method that performs projection by changing the size and shape of a rectangular beam. Thereafter, proposal has been made about a partial batch projection method that collectively projects or delineates a part of a pattern through a mask and repeats it in terms of improving pattern accuracy, shortening a projection time, and so on. Then, following the partial batch projection method, a new electron projection system (SCALPEL system) has been proposed by S. D. Berger et al., in APPL. PHYS. LETTERS 57 (2) (1990) 153. Thereafter, various proposals have been made about a similar projection system (PREVAIL system) and a transfer mask (reticle) structure for applying to those projection systems and its manufacturing method.

For example, Japanese Unexamined Patent Application Publication (JP-A) No. H07-201726 (corresp. to U.S. Pat. No. 5,466,904) relates to a PREVAIL system invented by H. C. Pfeiffer, wherein, schematically, preparation is made of a stencil mask formed with a through-hole (aperture) pattern of a predetermined size and arrangement in each of small regions and a charged particle beam is irradiated onto each small region so that a beam shaped through each through-hole pattern is applied onto an exposure-subject substrate formed thereon with a photosensitive material through an optical system, thereby transferring the through-hole patterns onto the exposure-subject substrate on a reduced scale. In addition, a device pattern is formed on the exposure-subject substrate while connecting together predetermined patterns formed in a divided manner on the mask. Transfer masks proposed for this system each use, as a main structure, a stencil-type mask having pattern portions formed by through holes that are uncovered at all (for example, see Japanese Unexamined Patent Application Publication (JP-A) No. H10-261584 (corresp. to U.S. Pat. No. 5,935,739), Japanese Unexamined Patent Application Publication (JP-A) No. H10-260523 (corresp. to U.S. Pat. No. 5,972,794)). In the stencil-type mask, a pattern region is divided and reinforced from the back side by a strut (crossbar) structure to achieve a reduction in deflection of the pattern region. This structure is effective to achieve an improvement in pattern position accuracy and so on.

On the other hand, as a mask structure for the SCALPEL system, scattering masks (reticles) have been mainly proposed rather than the stencil masks. These are specifically described in, for example, the above-mentioned literature by S. D. Berger et al., the above-referenced Japanese Unexamined Patent Application Publication (JP-A) No. H10-261584, Japanese Unexamined Patent Application Publication (JP-A) No. H10-321495, and soon. According to the description thereof, the mask structure is such that a heavy metal layer is formed on a membrane (self-standing thin film) of SiN or the like and desired pattern formation is applied to this heavy metal layer. Under the circumstances, when an electron beam is irradiated onto both layers, the electron scattering rate differs in dependence on the presence or absence of the electron beam scatterer. Therefore, a method is proposed such that a reduced pattern is transferred by obtaining a beam contrast on a wafer by the use of the difference in a scattering rate.

These exposure systems each satisfy high resolution that is a feature of the charged particle beam and enable pattern formation that is finer than 0.1 µm and, as compared with the partial batch method, achieve a large increase in shot size (e.g. the maximum shot size on an exposure-subject substrate increases from 5 µm to 250 µm) and an improvement in throughput in the manufacture of devices (e.g. exposure throughput of 30/hour or more at nominal in the case of 8-inch substrates and a minimum line width of 0.08 µm) because of the speedup of the system and so on. The systems make it possible to realize an apparatus capability of enabling adaptation to production of general-purpose devices, and thus are highly practical systems.

As described above, there have been released various proposals about the new exposure systems, about the transfer mask (reticle) structures for applying to those systems, and about the methods of manufacturing the masks. However, the situation is that there are various problems about various proposed mask structures in terms of practicality. Hereinbelow, those various problems will be briefly described.

The mask structures hitherto proposed are roughly classified into the two types that are the stencil mask where a pattern has a through-hole structure and the scattering mask where an electron beam scatterer made of a heavy metal is formed on a thin film transmitting layer having a thickness of 100 to 200 nm. Typical structure diagrams of them are shown in FIGS. 15 and 16.

As shown in FIG. 15, since transfer pattern portions of the stencil mask are through holes 1 formed in a membrane 2, there is almost no energy loss of projection electrons while, because of a pattern with a high aspect ratio, there are a problem about pattern size accuracy and a problem about mask strength since a pattern region (thin film portion) is thin (e.g. 2 µm) and has a through-hole structure. As a countermeasure for this, there is known a technique that improves the processing accuracy and strengthens the mask structure by forming struts (crossbars) (illustration is prepared) for supporting the pattern region (pattern field) from the back side of the mask. However, in the case of the through-hole structure, a ring-shaped (donut-shaped) pattern or the like cannot be formed in a completely independent form. As a coping method in this case, as H. Bohlen et al. describe in Solid State Technology, September (1984) pp. 210, there has been proposed a method of preparing complementary masks for assembling a desired component element pattern and of forming the pattern by overlapping complementary patterns. However, in this method, the masks are required twice at minimum and, further, the number of exposure shots increases to cause a large increase in exposure time, thereby reducing the exposure throughput. Further, there is also a demerit that mask data having a pattern properly divided is required per device pattern.

Further, when a reduction in thickness of the pattern region (thin film portion) is carried out for improving the processing accuracy (pattern size accuracy), a new problem arises. The transfer pattern portions of the stencil mask are through holes. No particular problem arises if a pattern formed in this case is only contact holes or a short line pattern. However, for reasons of element pattern design, problems often occur in cases where a pattern support portion is a cantilever-shaped pattern (hereinbelow referred to as a leaf pattern). In such cases, the leaf pattern is subjected to shrinkage displacement in a longitudinal direction (perpendicular to the surface of the mask) due to various conditions. Further, in the case of a line pattern having a high pattern density (e.g. LS ratio is 1:1) and being a fine pattern, a mechanical strength in a lateral direction (horizontal or parallel to the surface of the mask) is also reduced. In this case, if the Young's modulus of a material of the mask body is very large, it is possible to reduce the shrinkage displacement. However, even by applying a polycrystalline diamond film having the largest elastic modulus currently known to the aperture body, it is difficult to reduce the shrinkage displacement of the pattern region to a practical level as long as the thickness of the pattern support portion is reduced. In addition, in the SCALPEL or PREVAIL type apparatus, since the mask constantly moves at high speed in terms of the exposure system, when judging from a microscopic viewpoint, a very large force is exerted also on the mask pattern (including the leaf pattern) in the lateral direction. That is, the viewpoint of mask rigidity becomes important not only in the longitudinal direction but also in the lateral direction (parallel to the surface of the mask). However, since bending stress, torsional stress, and so on are applied to the leaf pattern portion due to high-speed movement of a mask stage and stress concentration occurs at the leaf pattern support portion, damage of the pattern might occur.

On the other hand, in the SCALPEL mask (electron beam scattering mask), there arise, in addition to a problem of durability of the mask, a problem of a loss in transmitting electron amount due to electron beam scattering at an electron beam transmitting layer (film) (referred to as a pattern support layer (film) or a membrane) caused by the mask structure. Description will be given on the basis of a sectional structure diagram (FIG. 16) of the foregoing electron beam scattering mask. The electron beam scattering mask ensures a contrast by a difference in electron scattering angle, which is caused depending on the presence of an electron beam scatterer 5, and restricted apertures. However, since a difficulty of film self-standing arises only by the electron beam scatterer 5 made of a heavy metal, it is necessary to form a pattern support layer 6 for the purpose of supporting the heavy metal scattering layer.

In the mask of this structure, there arises a contradictory problem between the thickness of the pattern support layer for supporting the electron beam scattering layer and the electron transmittance. That is, a material of the known pattern support layer is a SiN-based material or a Si material and, other than it, a diamond film or the like has also been proposed. As properties required for those pattern support layer materials, it is preferable that the material density be low and the material strength properties such as the Young's modulus be excellent. In other words, it can be said to be more preferable as the electron transmittance at the pattern support layer becomes more excellent and as the elastic modulus or the like of the material increases. In terms of only the electron transmittance, the problem can be solved by providing a higher acceleration voltage of a charged particle beam or reducing the thickness of the pattern support layer. Since the acceleration voltage of an electron source used in the SCALPEL or the like is a high acceleration voltage like 100 KeV or more, electrons achieve a transmittance of substantially 100% in the case of a thickness (50 to 200 nm) of a pattern support layer described in, for example, U.S. Pat. No. 5,260,151. However, electrons are scattered in any substance. Herein, it is noted that the scattered electrons pass through the pattern support layer and an electron outgoing angle from the pattern support layer has a predetermined range. In this event, the electrons having outgoing angles outside the predetermined range cannot pass through restricted apertures provided at an upper portion of an exposure-subject substrate in the exposure apparatus. This results in a reduction in rate of the electrons for exposure (referred to as exposure electrons). In order to reduce the number of scattered electrons outside the predetermined range, in other words, in order to increase the number of electrons that are transmitted without scattering, there is no alternative but to reduce the thickness of the pattern support layer being the support body. However, in the case of the heavy metal scatterer, for example, in the case of the scatterer of tungsten, a thickness of about 50 nm is sufficient for ensuring electron scattering of several times but, when, for example, a silicon nitride (SiN) based pattern support layer is applied, a SiN film having a thickness of about 100 to 150 nm is required in order to support the scatterer having the thickness of 50 nm in the case where the thickness of the film is set in terms of the material strength properties. When the pattern support layer of this thickness is used, electron scattering due to the pattern support layer under the acceleration voltage of 100 KeV is very large so that the rate of electrons that can contribute to exposure decreases to several %. If the thickness of the SiN pattern support layer is reduced, the pattern support layer is easily subjected to shrinkage due to self weight of the tungsten scatterer and, further, cannot bear a number of processing steps and, therefore, damage is liable to occur in the pattern support layer and so on.

As described above, when the electron beam scattering layer made of the heavy metal is too thin, the excellent beam contrast cannot be obtained. On the other hand, when the heavy metal electron beam scattering layer is increased in thickness for obtaining the excellent beam contrast, shrinkage occurs due to the self weight and damage and so on are liable to occur due to an increase in membrane stress change (change in warp) during the processing steps. Further, in order to support such a heavy metal electron beam scattering layer, the thickness of the pattern support layer should be increased considerably so that there has been the problem that the loss of the exposure electrons increases. Further, in the SCALPEL mask as described above, the reduction in thickness of the respective layers and the transmittance of non-scattered electrons are contradictory to each other so that it has conventionally been difficult to obtain a practical mask.

Moreover, when a mask stage is moved at high speed while the mask is used like in the case of the stencil mask, the pattern region (thin film portion) including the electron beam scatterer might be damaged quite easily. In addition, when the electron beam scatterer is made of the metal material such as tungsten, there is also a problem of surface oxidation. In the case of a material that is easily oxidized with age, a membrane stress thereof shifts in a compression direction following oxidation. As a result, it is presumed that it becomes difficult to ensure the mask performance over a long-term period.

In order to solve the foregoing problems, the inventor of this application has proposed a SCALPEL mask where the thickness of an electron beam scattering layer is increased while the thickness of a pattern support layer is reduced (Japanese Unexamined Patent Application Publication (JP-A) No. 2001-77013 (corresp. to U.S. Pat. No. 6,812,473)).

The thickness of the electron beam scattering layer is increased (thickness 0.2 μm to 2 μm) to thereby achieve film self-standing of the electron beam scattering layer and, as a result, the thickness of the pattern support layer is reduced (thickness 0.005 μm to 0.2 μm) to thereby reduce loss of electron beams at the pattern support layer, aiming further to obtain optimal membrane stresses with respect to the respective pattern layers. With respect to materials of the respective layers that enable such a mask structure, disclosure is made of, as the electron beam scattering layer, carbon element and/or silicon element, specifically, diamond like carbon (hereinbelow, DLC), a material obtained by doping at least one of B, N, Si, and P into DLC (doping amount is 0.1 to 40 mol %), or a material containing silicon as a main component. On the other hand, as the pattern support layer, disclosure is made of DLC, a material obtained by doping at least one of B, N, Ti, Si, and Al into DLC (doping amount is 0.1 to 40 mol %), a material containing silicon as a main component, SiC, or TiC.

The pattern support layer disclosed in the foregoing publication has a problem that the membrane stress changes from a tensional stress to a compressive stress with the lapse of time and it has been found that a change amount thereof increases as the membrane thickness decreases. However, the membrane thickness is preferably thinner in terms of the electron beam transmitting amount and so on so that it becomes necessary to form a pattern support layer having excellent membrane quality for reducing the time-dependent change of the stress with the thin membrane thickness.

SUMMARY OF THE INVENTION

Therefore, it is an object of this invention to obtain a pattern support layer having a thin thickness wherein a time-dependent change in stress is small.

Specifically, this invention has each of the following structures.

(Structure 1)

A mask blank for electron beam exposure, the mask blank comprising a pattern support layer that transmits an electron beam therethrough, an electron beam scattering layer formed on the pattern support layer, and a support body supporting the pattern support layer and the electron beam scattering layer, wherein:

the pattern support layer is made of a material having an amorphous structure and mainly composed of carbon-silicon bonds, the pattern support layer being a tensional stress membrane that has a surface roughness of 0.2 (nm, Rms) or less.

(Structure 2)

The mask blank according to structure 1, wherein, in the material having an amorphous structure and mainly composed of carbon-silicon bonds, a ratio of silicon falls within a range specified by: 40<(silicon content atm %)/(silicon content atm %+carbon content atm %)<60.

(Structure 3)

The mask blank according to structure 1, wherein a thickness of the pattern support layer is 5 to 55 nm.

(Structure 4)

The mask blank according to structure 3, wherein the electron beam scattering layer is twice as thick as the pattern support layer.

(Structure 5)

The mask blank according to structure 1, wherein the electron beam scattering layer is made of a mixture material of carbon and silicon.

(Structure 6)

The mask blank according to structure 5, wherein the material of the electron beam scattering layer containing carbon and silicon as main components satisfies: 40<(silicon content atm %)/(silicon content atm %+carbon content atm %)<60.

(Structure 7)

The mask blank according to structure 5, wherein a thickness of the electron beam scattering layer falls within a range of 0.1 to 1.5 μm.

(Structure 8)

The mask blank according to structure 6, wherein a thickness of the electron beam scattering layer falls within a range of 0.1 to 1.5 μm.

(Structure 9)

The mask blank according to structure 1, further comprising etching stopper layers between the pattern support layer and the electron beam scattering layer and between the pattern support layer and the support body.

(Structure 10)

A mask for electron beam exposure, the mask being formed by patterning the electron beam scattering layer of the mask blank according to structure 1 by a lithography method.

BRIEF DESCRIPTION OF THE DRAWINGS

FIG. 6 is a table showing membrane properties of pattern support layers;

PREFERRED EMBODIMENTS OF THE INVENTION

FIGS. 1 to 6 show the results of evaluating pattern support layers each of which is formed as a membrane of a mixture of carbon and silicon on a support body of a Si substrate by a sputtering method carried out in a multi-cathode system by the use of Ar gas. In the pattern support layers, materials of the membranes have different Si contents (% represents atm % in the figures) relative to C. As a comparison, the results of evaluating a DLC film formed by Ar sputtering by using a carbon target is simultaneously shown.

Figure 1:
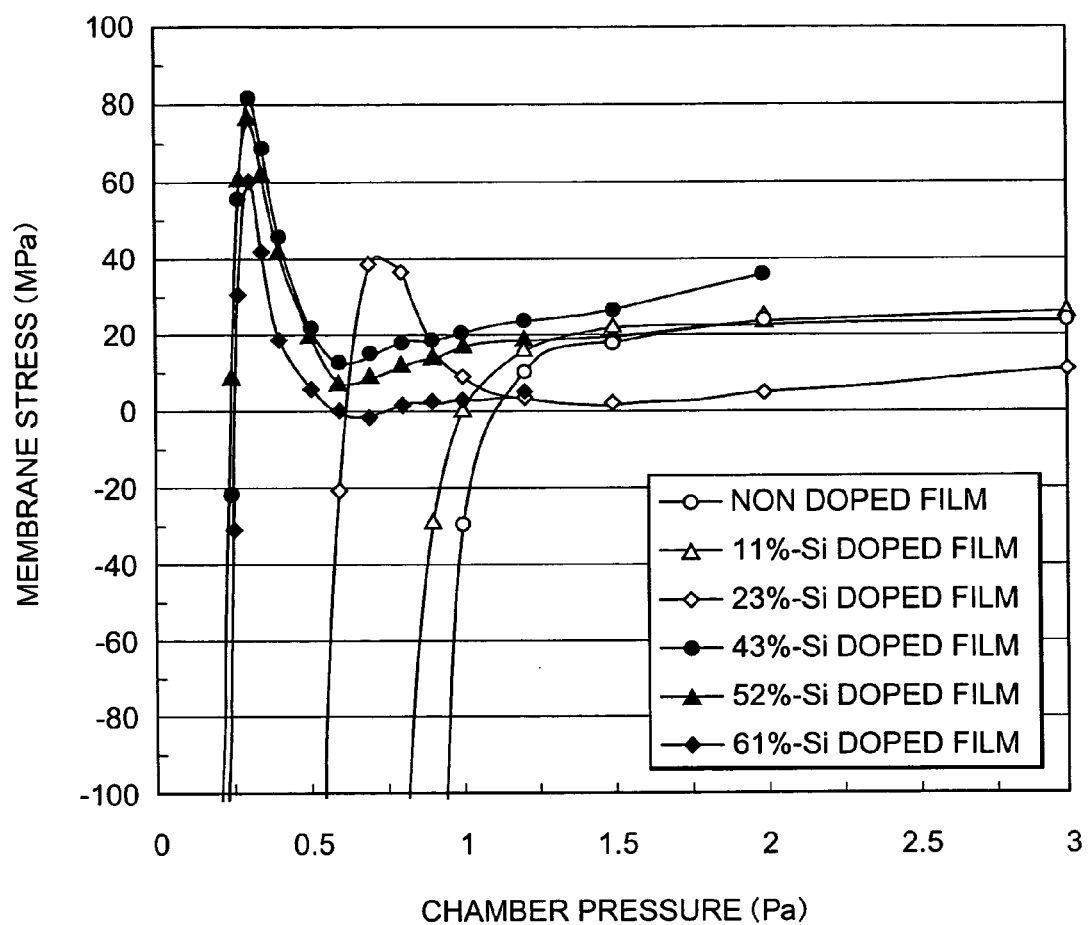
FIG. 1 is a graph showing a relationship between a deposition pressure and a membrane stress with respect to each of pattern support layers.
Figure 2:
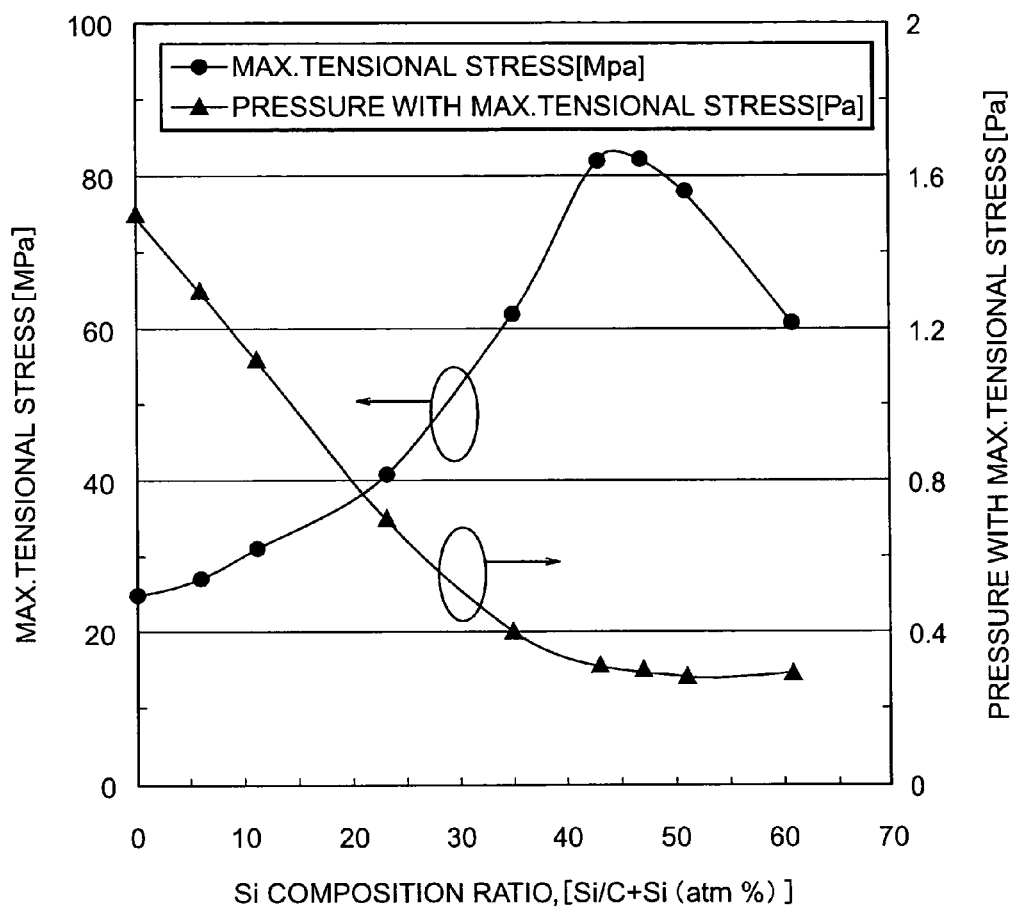
FIG. 2 is a graph showing a relationship among a composition, a maximum membrane stress, and a deposition pressure when the maximum membrane stress is obtained, with respect to each of pattern support layers.
Figure 3:
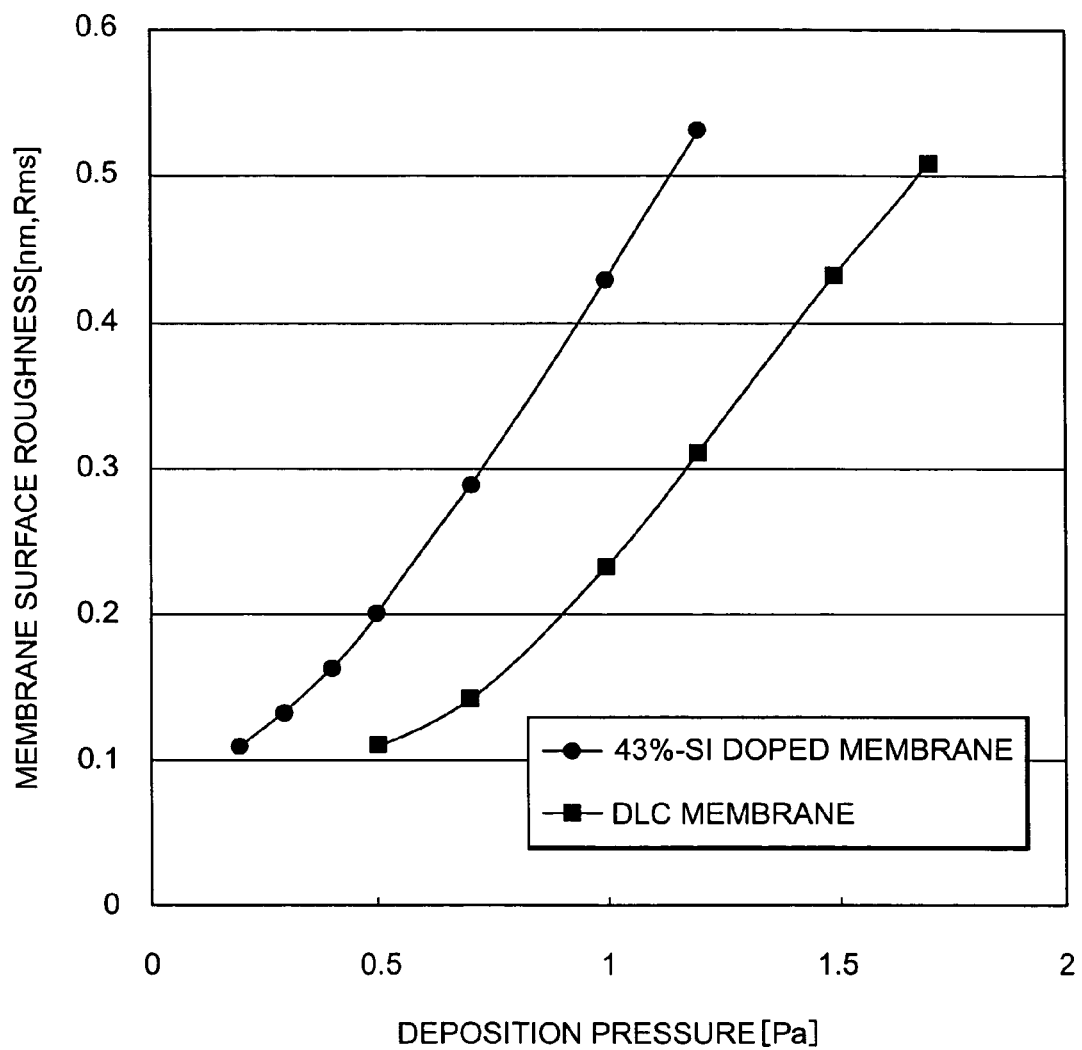
FIG. 3 is a graph showing a relationship between a deposition pressure and a surface roughness with respect to each of pattern support layers.

First, FIG. 1 shows a relationship between a membrane stress and a deposition pressure with respect to each of the foregoing pattern support layers. On the other hand, FIG. 2 shows maximum tensional stresses relative to changes in addition amount of Si and deposition pressures when those maximum tensional stresses are obtained, with respect to the foregoing pattern support layers. From the results of FIGS. 1 and 2, it is understood that as the content of Si increases, the tensional stress increases (while the membrane stress decreases as the Si content increases when it is 60 atm % or more). Further, it is understood that as the content of Si increases, the deposition pressure when the maximum tensional stress is obtained shifts to a high vacuum side. It is necessary that the pattern support layer is controlled to a tensional stress so as to be supported on the support body. From the foregoing results, it has been found that the tensional stress can be obtained in high-vacuum or low-pressure deposition by the inclusion of Si. Further, the membrane of a fine quality can be obtained in the low-pressure deposition. FIG. 3 shows a relationship between a deposition pressure and a membrane surface roughness (Rms) after the deposition with respect to each of Si—C mixed pattern support layers and DLC pattern support layers. When the surface roughness is small, it is possible to improve uniformity of the transmitting electron amount and, further, it is possible to estimate fineness of the membrane by the surface roughness. From the results, it is understood that as the deposition pressure approaches a high vacuum, the membrane having a smoother surface can be obtained and that although this relationship also depends on the presence of the Si inclusion, dependence on the deposition pressure is larger.

Therefore, it is understood from FIGS. 1 to 3 that the pattern support layers each having a tensional stress and being fine (surface roughness is small) can be obtained by the inclusion of Si.

Figure 4:
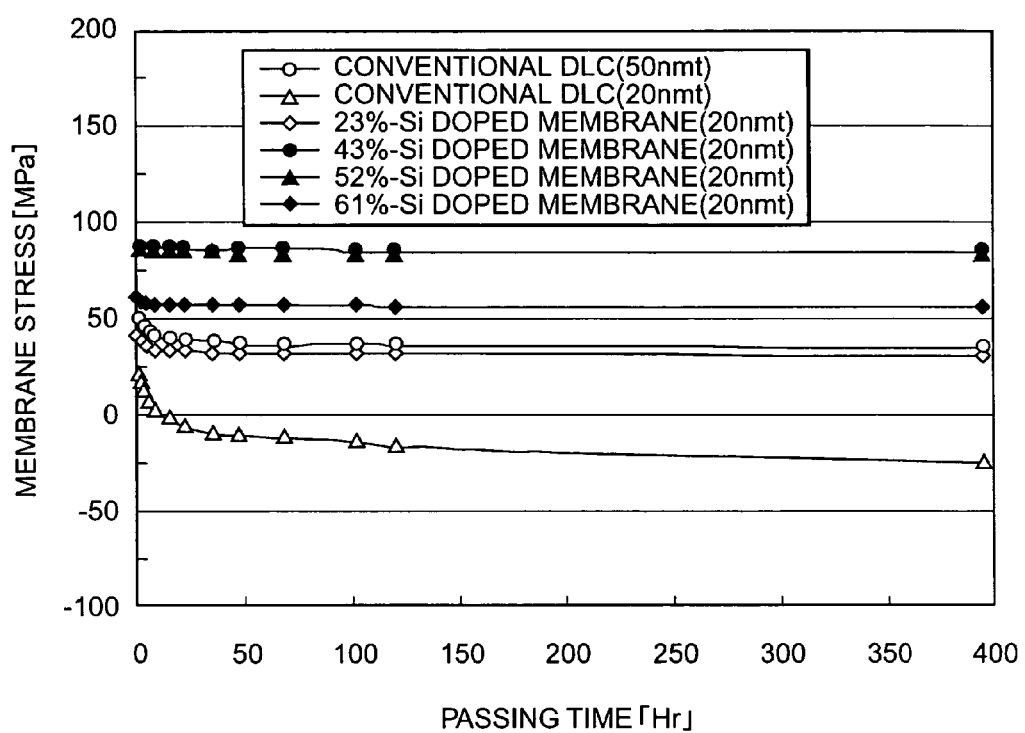
FIG. 4 is a graph showing a change in membrane stress with the lapse of time with respect to each of pattern support layers.

The results of examining influence given to time-dependent changes in membrane stress with respect to those pattern support layers each having the tensional stress and being fine (surface roughness is small) are shown in FIG. 4. FIG. 4 shows a relationship of a membrane stress relative to a passing time with respect to each of the pattern support layers. In FIG. 4, as seen from examples of the DLC pattern support layers having different thicknesses, the time-dependent change increases as the thickness decreases. Therefore, special attention should be given to the thin pattern support layer required in the invention of this application. Further, among the pattern support layers having a thin thickness of 20 nm, there are obtained the results where the time-dependent changes in membrane stress are the lowest like 3 MPa or less with respect to the pattern support layers containing Si in the range exceeding 40% and less than 60%.

Figure 5:
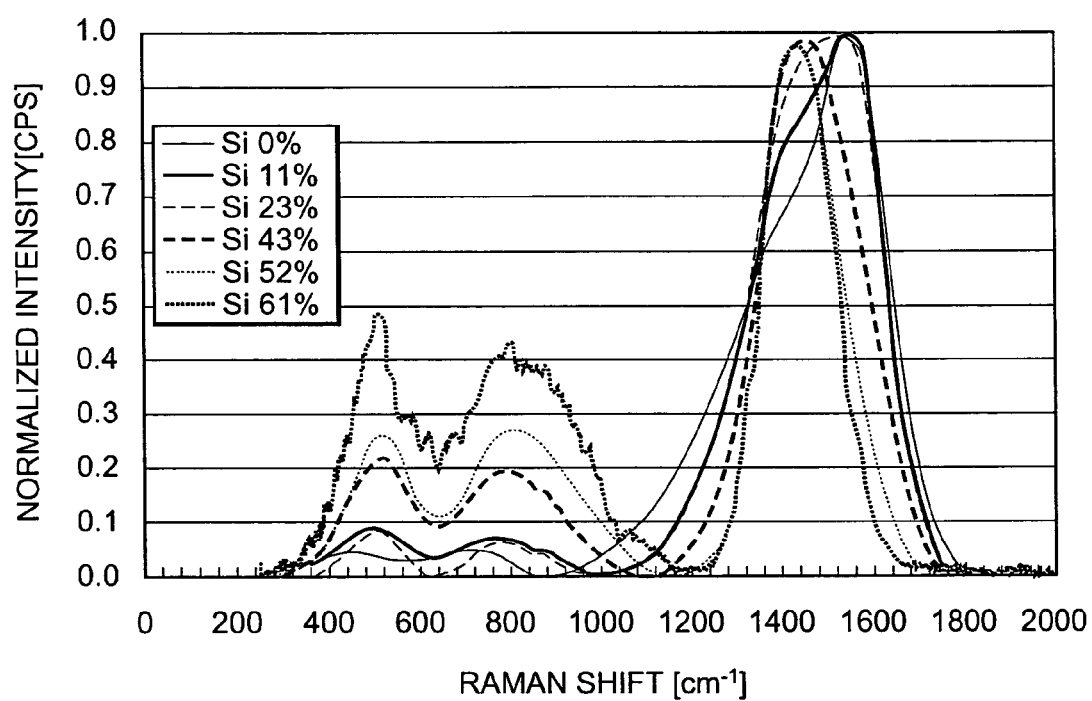
FIG. 5 is a graph showing the results of a Raman spectrum analysis of a material of each of pattern support layers.

FIG. 5 shows the results of analyzing the materials of the respective pattern support layers by the Raman spectrum. Peaks caused by the Si substrates in the obtained measurement data are excluded and the data is normalized by maximum peak intensities of respective data. From the results, it is understood that as the addition amount of Si increases, peaks caused by C—C bonds decrease while peaks caused by Si—C bonds increase. Further, since the peaks are broad, it can be said that the membranes all have amorphous structures. In the case of adding Si amount to 40 atm % or more, the membrane is formed by random Si—C bonds and, in the case of 60% or more, excessive Si exists in the form of Si—Si bonds.

FIG. 6 is a table summarizing membrane properties of some of the pattern support layers. As the film hardness (GPa) increases and as the Young's modulus (GPa) increases, the material is excellent in mechanical strength so that it is possible to reduce shrinkage when the pattern support layer is supported on the support body. Although the film density ($g/cm^3$) increases as the Si amount increases, it is only about 10% and causes no adverse influence. As the membrane surface roughness (m, Rms) becomes smoother, uniformity of the transmitting electron amount becomes more excellent. According to FIG. 6, the properties of the membrane of a random structure containing 43 atm % of Si and mainly composed of Si—C bonds are most excellent.

Figure 7:
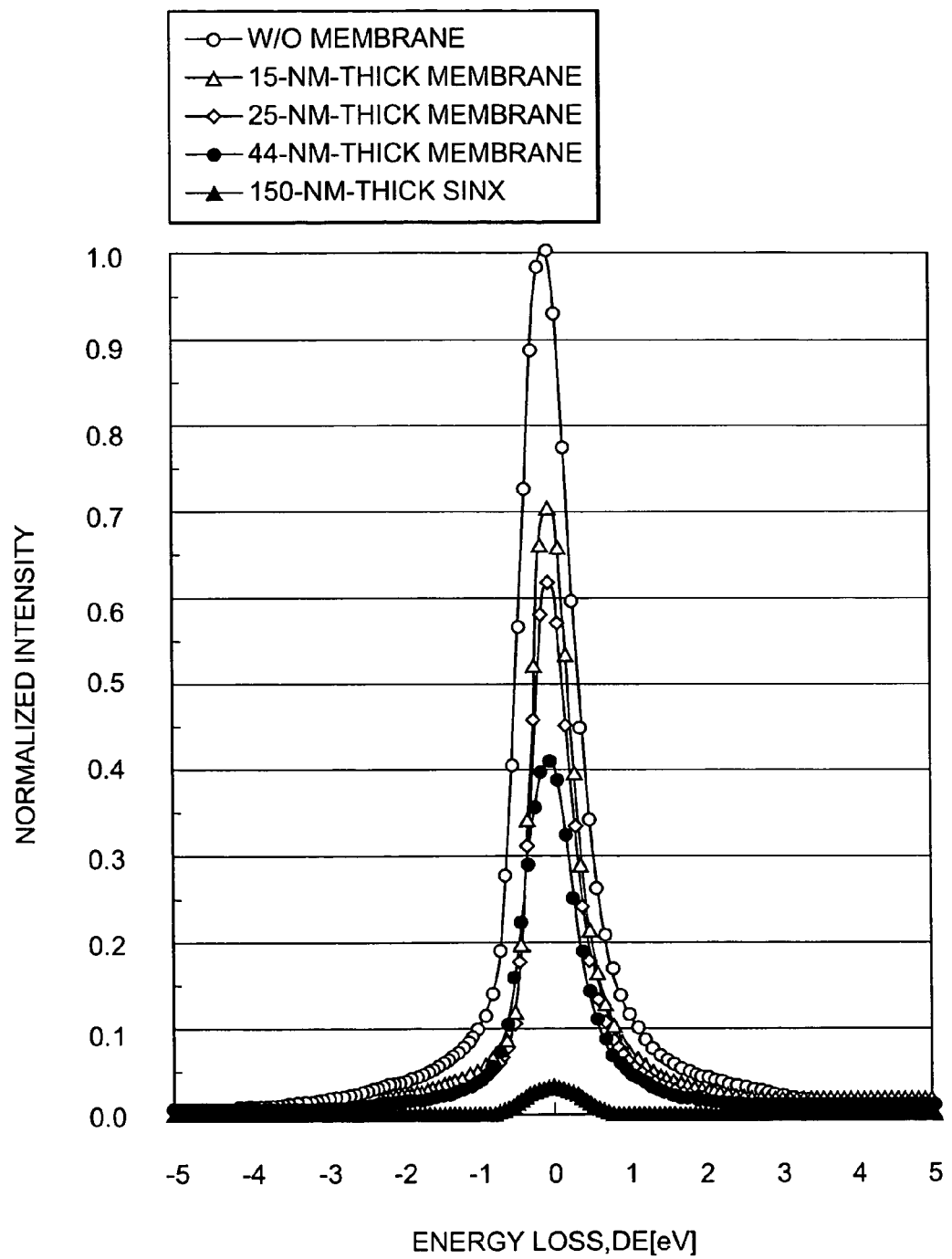
FIG. 7 is a graph showing energy distribution of electrons passing through each of pattern support layers.
Figure 8:
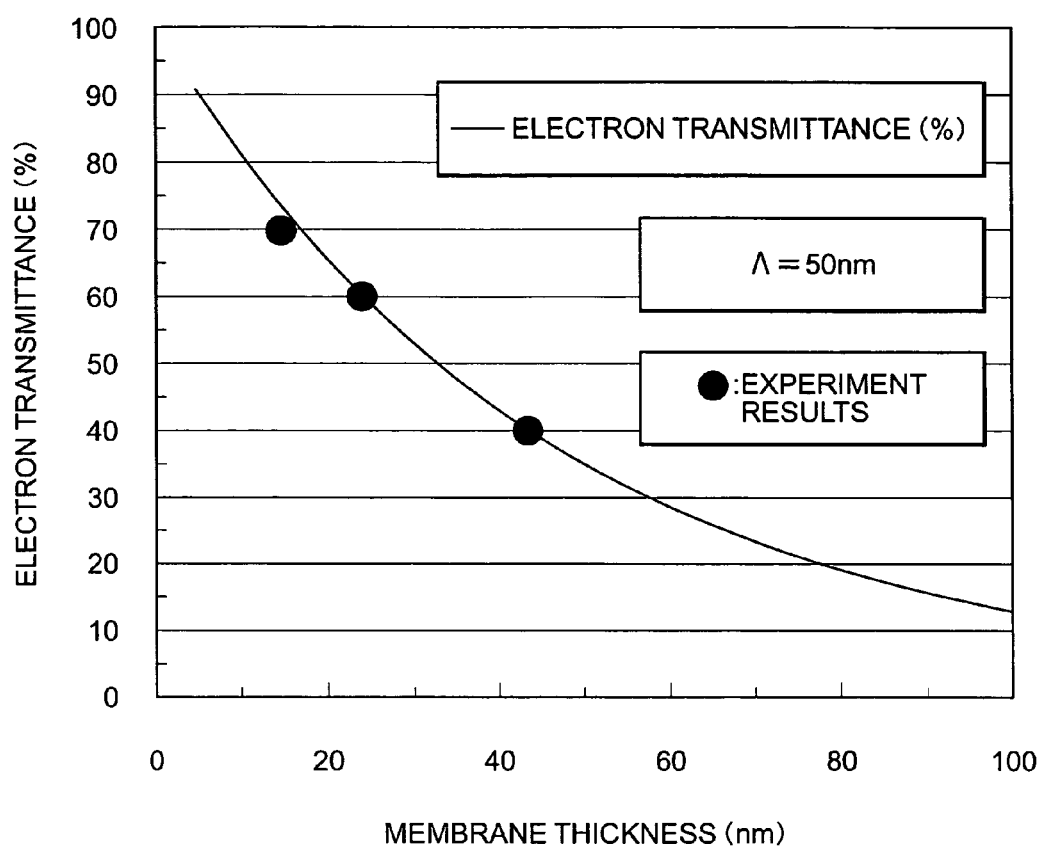
FIG. 8 is a graph showing a relationship between a membrane thickness and an electron transmittance of each of pattern support layers.

Next, FIGS. 7 and 8 show the results of measuring the rate of electrons that are transmitted through each of support membranes without scattering (non-scattered electron transmittance) using the thickness of the pattern support layer as a parameter. Samples used are a SiN membrane having a thickness of 150 nm, a DLC membrane having a thickness of 44 nm, and Si added films (43 atm % in this case) of this invention having a thickness of 25 nm and a thickness of 15 nm, respectively. For a comparison, the transmittance property of a SiN pattern support layer is included.

In the data, the electron transmittance with no energy loss in the state of no support membrane is normalized by 1 and, what is obtained by multiplying the data by 100 corresponds to the non-scattered electron transmittance of the support membrane concerned. In FIG. 7, part of the transmitting properties of FIG. 6 are plotted. A curve in the figure represents a relationship between the thickness of the pattern support layer (membrane) and the non-scattered electron beam transmittance (%). The electron beam transmittance (T %) is given by $$T(\%) = \exp(-tm/\Lambda) \times 100$$

where tm: thickness of pattern support layer and $\Lambda$: mean free path of 100 keV electrons in inelastic scattering.

From FIGS. 7 and 8, it is understood that the electron beam transmittance increases as the thickness of the pattern support layer decreases and further understood that it coincides with the Exp. curve.

Figure 9:
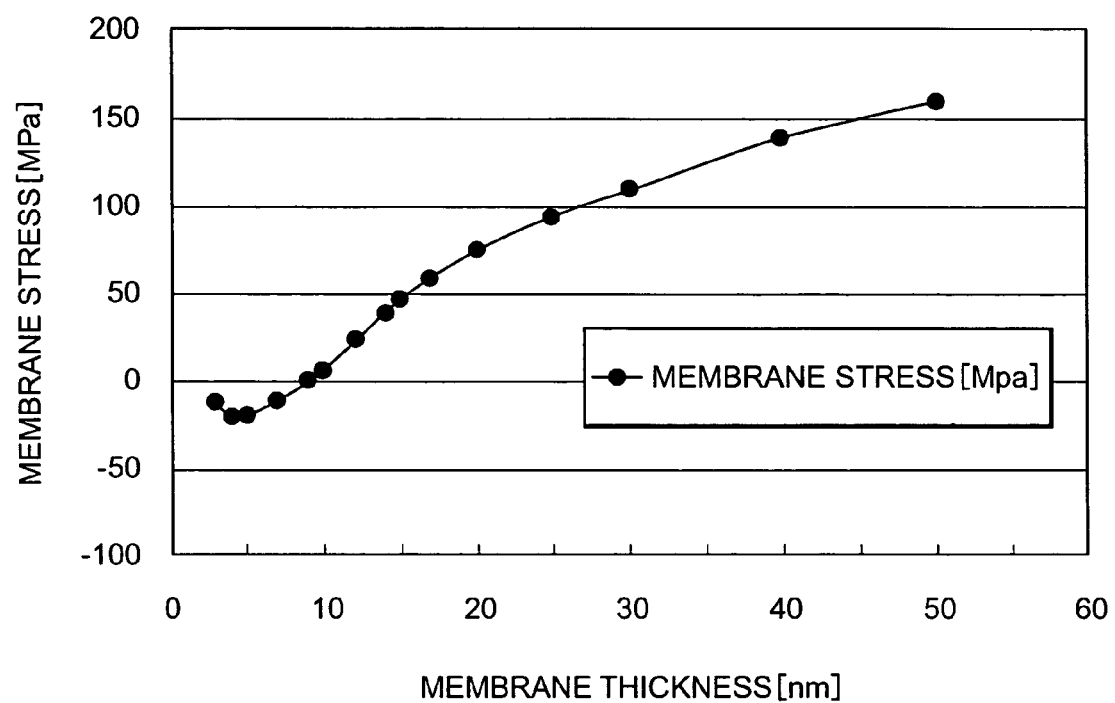
FIG. 9 is a graph showing a relationship between a membrane thickness and a membrane stress of each of pattern support layers.

FIG. 9 shows a relationship between a thickness and a membrane stress of each of pattern support layers (membranes). It is understood that the support membrane of this invention has a tensional stress even in the case of a thickness of 10 nm.

Next, description will be directed to an electron beam projection mask blank and an electron beam projection mask in this invention.

Figure 10A:
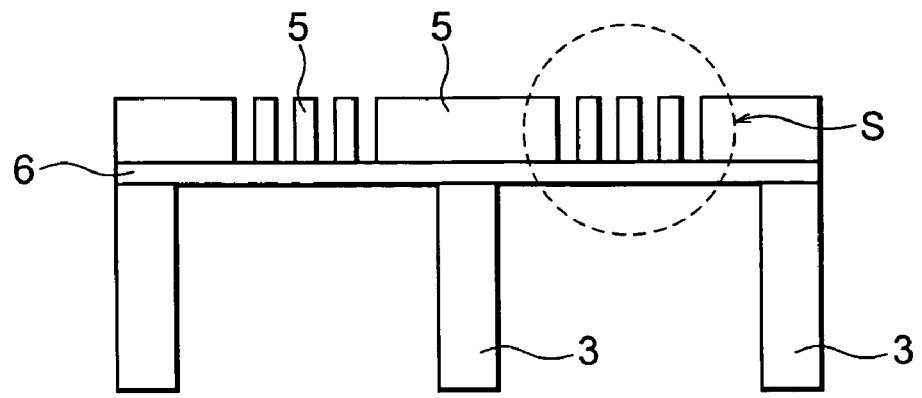
FIG. 10A is a sectional view showing a structure of a mask according to one embodiment of this invention.
Figure 10B:
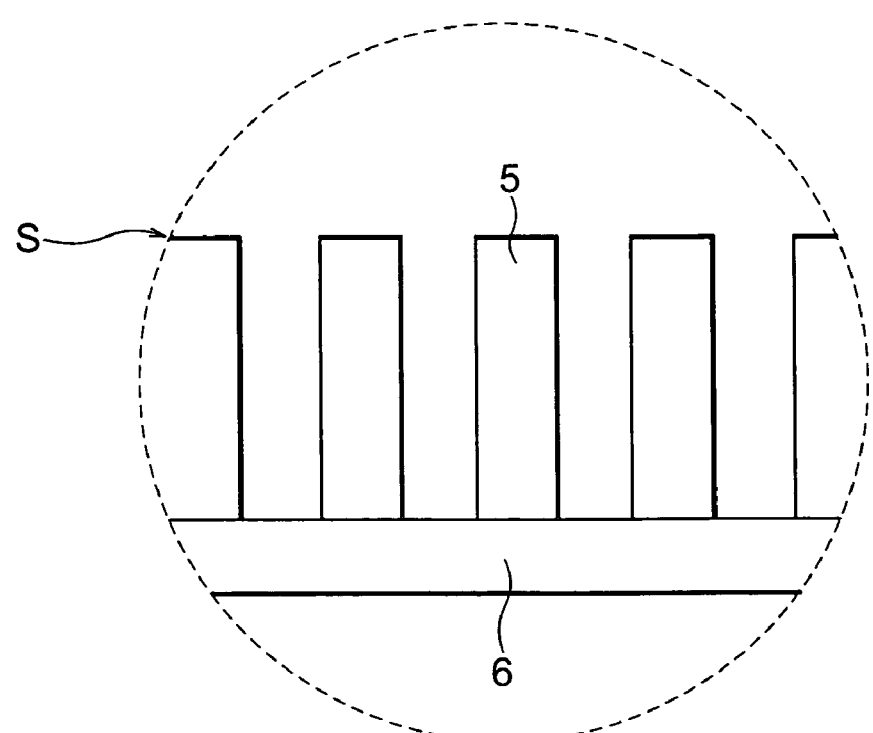
FIG. 10B is a partial enlarged view of FIG. 10A.
Figure 11A:
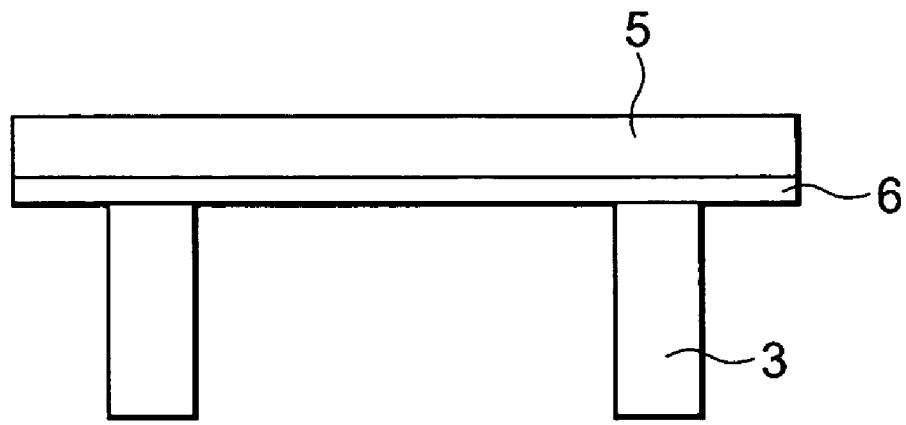
FIGS. 11A and 11B are sectional views showing structures of mask blanks according to one embodiment of this invention, wherein two modes are respectively shown.
Figure 11B:
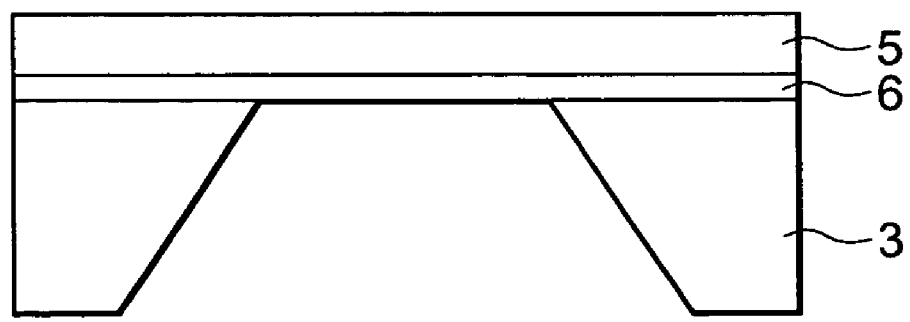
Figure 12A:
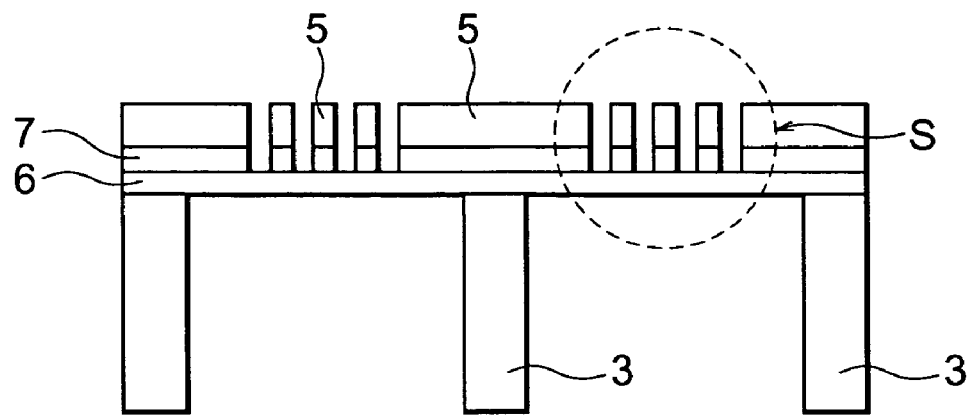
FIG. 12A is a sectional view showing a structure of a mask according to another embodiment of this invention.
Figure 12B:
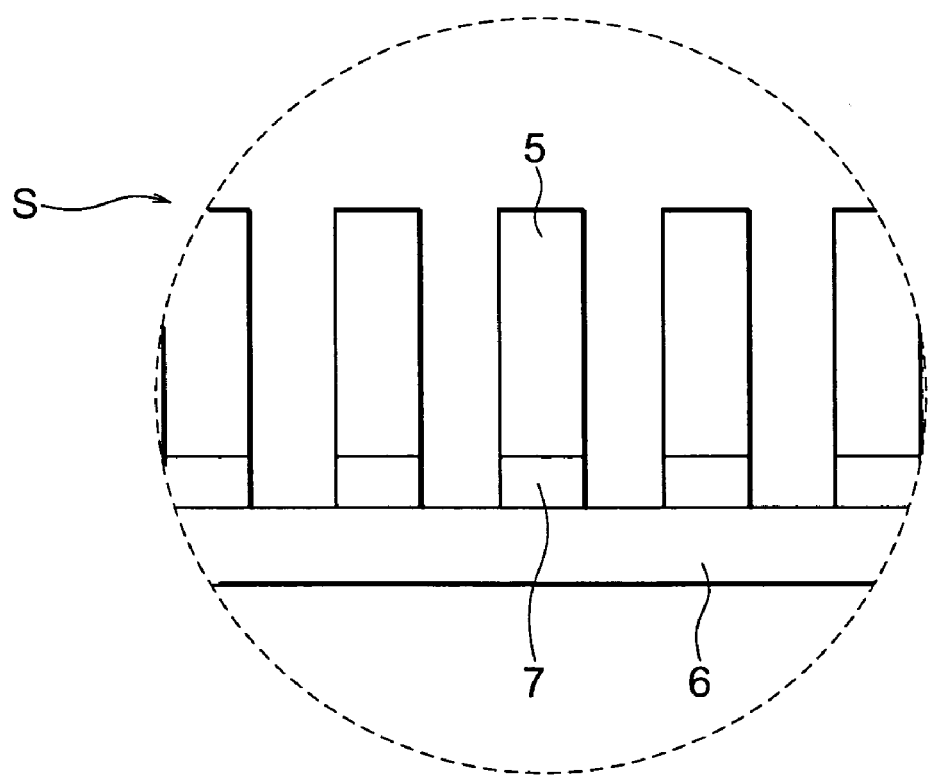
FIG. 12B is a partial enlarged view of FIG. 12A.
Figure 13A:
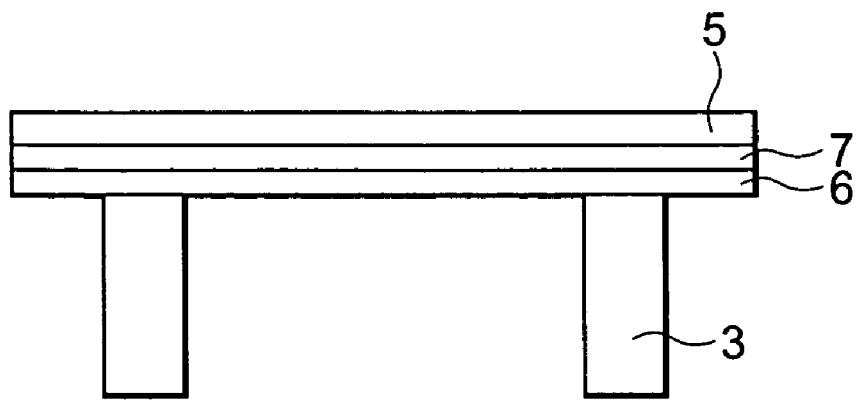
FIGS. 13A and 13B are sectional views showing structures of mask blanks according to another embodiment of this invention, wherein two modes are respectively shown.
Figure 13B:
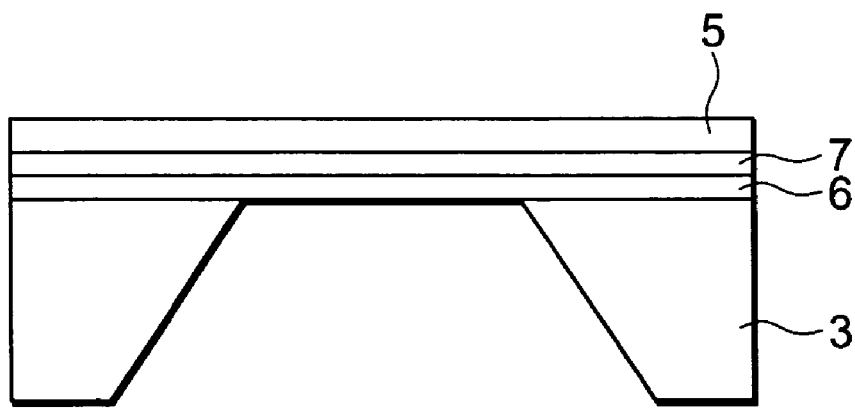

FIGS. 10A to 13B show structure examples of masks and mask blanks of this invention. FIG. 10A is a sectional view showing a structure example of a mask and FIG. 10B is a partial enlarged view of FIG. 10A. FIGS. 11A and 11B are sectional views showing two modes of structure examples of mask blanks. FIG. 12A is a sectional view showing another structure example of a mask and FIG. 12B is a partial enlarged view of FIG. 12A. FIGS. 13A and 13B are sectional views showing two modes of other structure examples of mask blanks. In figures, 5 denotes an electron beam scattering layer (electron beam scatterer pattern), 6 denotes a pattern support layer (pattern support membrane), 3 denotes a support body, and 7 denotes an etching stopper layer. Materials of the mask may be any materials as long as they satisfy the mask properties of this invention, while description will be made about representative material structure examples and preparation examples. Although only the etching stopper layer 7 for etching of the electron beam scattering layer 5 is shown in FIGS. 12A and 12B and FIGS. 13A and 13B, there is, actually, also provided an etching stopper layer for back-side processing etching.

Figure 14A:
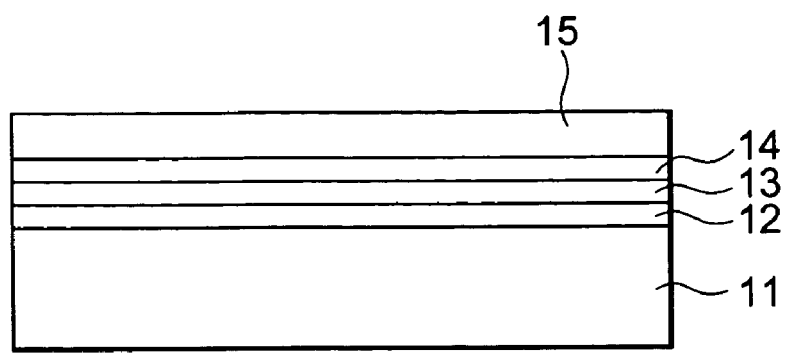
FIGS. 14A, 14B, and 14C are sectional views showing manufacturing processes of a mask according to one embodiment of this invention.
Figure 14B:
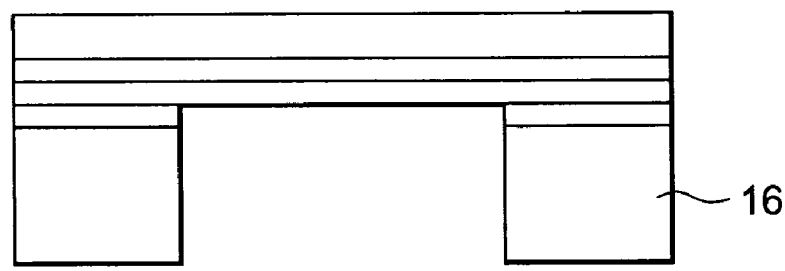
Figure 14C:
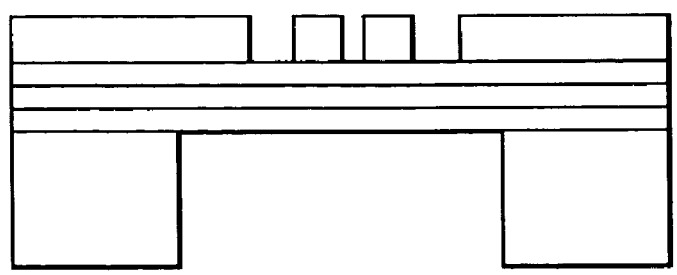
Figure 15:
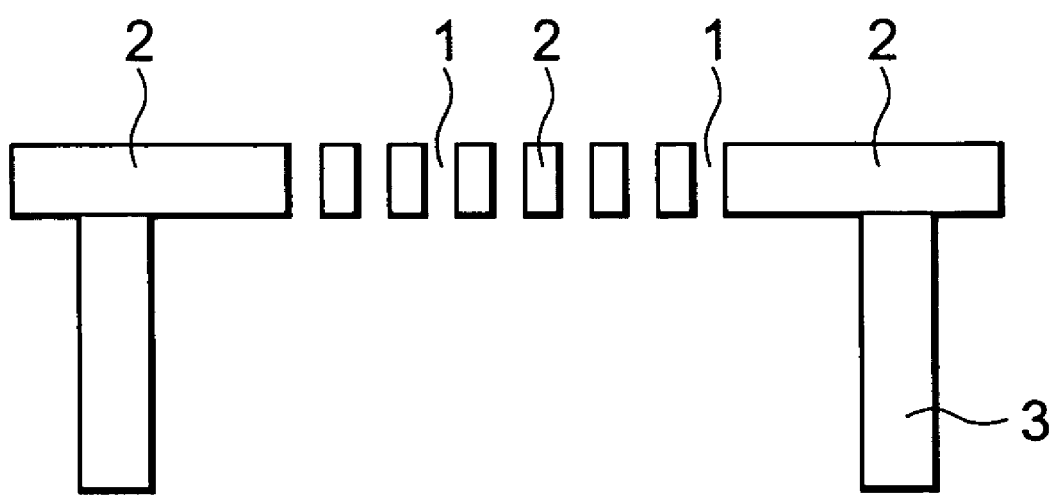
FIG. 15 is a sectional view showing a structure of a stencil mask.
Figure 16:
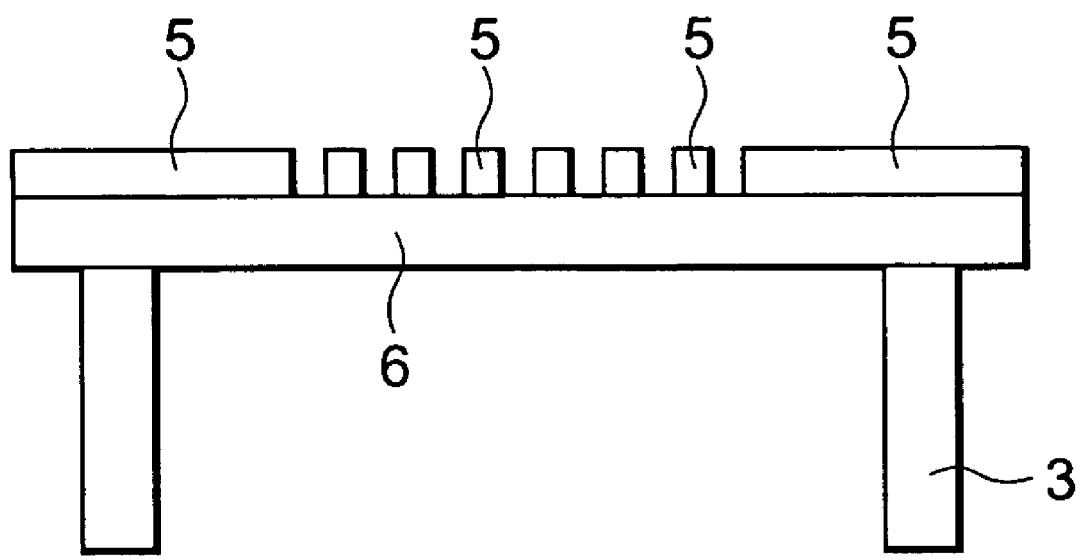
FIG. 16 is a sectional view showing a structure of a SCALPEL mask (electron beam scattering mask).

As shown in FIGS. 14A, 14B, and 14C, sputter deposition was carried out in an atmosphere of Ar and nitrogen by the use of a chromium target to form a back-side stopper 12 made of CrN on a silicon substrate 11. Then, sputter deposition was carried out in an Ar atmosphere under a gas pressure of 0.3 Pa by the use of a Si target and a C target to form a pattern support layer 13 (thickness 15 nm, surface roughness 0.131 nm, Rms, and membrane stress 50 MPa) having amorphous Si—C bonds on the back-side stopper 12. Then, sputter deposition was carried out in an atmosphere of Ar and nitrogen by the use of a chromium target to form a CrN etching stopper layer 14 (thickness 20 nm) for scattering layer etching. It is to be noted that the etching stopper layer was controlled that had a low stress falling within ±10 MPa. Then, sputter deposition was carried out in an Ar+He atmosphere by the use of a target like that in the deposition of the pattern support layer to form an electron beam scattering layer 15 (thickness 450 nm) mainly composed of amorphous Si—C bonds (FIG. 14A). The stress of this electron beam scattering layer was controlled so that it was rendered Into about 0.8 MPa. Subsequently, Si was etched from the back side of the substrate by a dry etching method to remove the exposed etching stopper, thereby forming a support body (support pillar) 16 that supports a pattern region (FIG. 14B). Then, from an upper surface of the electron beam scattering layer 13, there was formed a resist pattern having a desired pattern shape according to a lithography method (resist application, exposure, development, etc.). Then, the electron beam scattering layer 13 was etched by an ECR-type high density plasma etching method and, subsequently, exposed portions of the etching stopper layer were removed by wet etching and thereafter the remaining resist pattern was stripped (FIG. 14C).

Since the electron beam projection mask thus manufactured has the thin-film pattern support layer, the electron beam transmittance is high so that a device pattern can be exposed at high throughput. Further, since there is almost no time-dependent change in tensional stress of the pattern support layer, it is possible to obtain the exposure properties that are stable over a long-term period.

It is preferable in terms of self-standing that the pattern support layer have a tensional stress greater than 0 but not greater than 500 MPa. On the other hand, it is preferable in terms of improving fineness of the membrane and uniformity of the transmitting electron amount that the surface roughness of the pattern support layer be set to 0.2 (m, Rms) or less. More preferably, it is 0.15 (nm, Rms) or less.

In the foregoing embodiment, CrN is used as the material of the etching stopper. However, another material may be used as long as it is a material having a resistance (etching selection ratio is 700 or more) to etching of the SiC electron beam scattering layer. Further, the stress of the etching stopper is preferably controlled to the low stress such that the stress is near zero (within ±10 MPa), in order to prevent the stress from changing before and after the removal of the exposed portions. As a material of such an etching stopper, there can be applied, for example, other than CrN, a chromium compound such as $CrO_xN_y$, $Cr_xN_y$, or $Cr_xO_y$, a compound of a transition metal such as Ti, Zr, Nb, W, or Mo, or a compound of a semimetal material such as Si or Sb.

Further, with respect also to the electron beam scattering layer, a material other than SiC may be used as long as it is a material that is excellent in resistance to electron beam irradiation and can be subjected to dry-etch processing or the like so as to be formed into a mask. As such a material, there can be cited DLC, amorphous carbon, a silicide compound such as MoSi or ZrSi, or a compound containing Ti, V, Cr, Zr, Nb, Ge, or the like and further containing at least one of nitrogen, oxygen, carbon, and the like. Naturally, it may also be a compound of two or more kinds of alloys. However, since it is desirable to add the self-standing property to the film by providing a thickness of 0.1 μm or more, it is preferably made of a material having a material density of Si, C, or the like being 10 g/cm³ or less. As a composition when composed of Si and C, it is preferable that the ratio of Si falls within a range specified by 40<(silicon content atm %)/(silicon content atm %+carbon content atm %)<60.

While this invention has thus far been described in connection with the preferred embodiments thereof, it will be readily possible for those skilled in the art to put this invention into practice in various other manners without departing from the scope set forth in the appended claims.

What is claimed is:

1. A mask blank for electron beam exposure, the mask blank comprising a pattern support layer that transmits an electron beam therethrough, an electron beam scattering layer formed on the pattern support layer, and a support body supporting the pattern support layer and the electron beam scattering layer, wherein:

the pattern support layer is made of a material having an amorphous structure and mainly composed of carbon-silicon bonds, the pattern support layer being a tensional stress membrane that has a surface roughness of 0.2 (nm, Rms) or less.

2. The mask blank according to claim 1, wherein, in the material having an amorphous structure and mainly composed of carbon-silicon bonds, a ratio of silicon falls within a range specified by: 40<(silicon content atm %)/(silicon content atm %+carbon content atm %)<60.

3. The mask blank according to claim 1, wherein a thickness of the pattern support layer is 5 to 55 nm.

4. The mask blank according to claim 3, wherein the electron beam scattering layer is twice as thick as the pattern support layer.

5. The mask blank according to claim 1, wherein the electron beam scattering layer is made of a mixture material of carbon and silicon.

6. The mask blank according to claim 5, wherein the material of the electron beam scattering layer containing carbon and silicon as main components satisfies: 40<(silicon content atm %)/(silicon content atm %+carbon content atm %)<60.

7. The mask blank according to claim 5, wherein a thickness of the electron beam scattering layer falls within a range of 0.1 to 1.5 μm.

8. The mask blank according to claim 6, wherein a thickness of the electron beam scattering layer falls within a range of 0.1 to 1.5 μm.

9. The mask blank according to claim 1, further comprising etching stopper layers between the pattern support layer and the electron beam scattering layer and between the pattern support layer and the support body.

10. A mask for electron beam exposure, the mask being formed by patterning the electron beam scattering layer of the mask blank according to claim 1 by a lithography method.

* * * * *